United States Patent
Lin et al.

(10) Patent No.: US 11,637,559 B2
(45) Date of Patent: *Apr. 25, 2023

(54) METHOD OF OPERATING ANALOG-TO-DIGITAL CONVERTER BY REVERSED SWITCHING TECHNIQUE AND ANALOG-TO-DIGITAL CONVERTER UTILIZING SAME

(71) Applicant: Realtek Semiconductor Corp., HsinChu (TW)

(72) Inventors: Kai-Yue Lin, HsinChu (TW); Wei-Jyun Wang, HsinChu (TW); Shih-Hsiung Huang, HsinChu (TW); Kai-Yin Liu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/518,553

(22) Filed: Nov. 3, 2021

(65) Prior Publication Data
US 2022/0393694 A1    Dec. 8, 2022

(30) Foreign Application Priority Data
Jun. 4, 2021   (TW) ................................ 110120503

(51) Int. Cl.
*H03M 1/06* (2006.01)
(52) U.S. Cl.
CPC ................................ *H03M 1/0673* (2013.01)
(58) Field of Classification Search
CPC .................................................... H03M 1/0673
See application file for complete search history.

(56) References Cited

U.S. PATENT DOCUMENTS 8,508,400 B2    8/2013    Wu
8,933,830 B1 *  1/2015    Jeon ..................... H03M 1/1071
                                               341/110

(Continued)

FOREIGN PATENT DOCUMENTS

CN    102843140 B    6/2015
CN    105553479 B    8/2018

(Continued)

OTHER PUBLICATIONS

J. Tsai et al., "A 0.003 mm2 10 b 240 MS/s 0.7 mW SAR ADC in 28 nm CMOS With Digital Error Correction and Correlated-Reversed Switching," in IEEE Journal of Solid-State Circuits, vol. 50, No. 6, pp. 1382-1398, Jun. 2015, doi: 10.1109/JSSC.2015.2413850.

(Continued)

*Primary Examiner* — Lam T Mai
(74) *Attorney, Agent, or Firm* — Winston Hsu

(57) ABSTRACT

A method of operating an analog-to-digital converter includes in a first conversion period, a comparator generating a first comparison result, a first selection circuit switching a voltage output to a first capacitor of a set of larger capacitor of a first capacitor array, and a second selection circuit switching a voltage output to a second capacitor of a set of larger capacitor of a second capacitor array, and in a second conversion period after the first conversion period, the comparator generating a second comparison result different from the first comparison result, the first selection circuit switching back the voltage output to a first capacitor portion of the first capacitor of the set of larger capacitor of the first capacitor array, and the second selection circuit switching back the voltage output to a first capacitor portion of the second capacitor of the set of larger capacitor of the second capacitor array.

16 Claims, 2 Drawing Sheets

(56) References Cited

U.S. PATENT DOCUMENTS

| | | | | |
|---|---|---|---|---|
| 11,489,539 B1* | 11/2022 | Lin | | H03M 1/466 |
| 2004/0227654 A1* | 11/2004 | Yang | | H03M 1/682 |
| | | | | 341/172 |
| 2005/0078025 A1* | 4/2005 | Cai | | H03M 1/164 |
| | | | | 341/162 |
| 2009/0273501 A1* | 11/2009 | Madhavan | | H03M 1/068 |
| | | | | 341/158 |
| 2010/0283645 A1* | 11/2010 | Haneda | | H03M 1/0639 |
| | | | | 341/122 |
| 2011/0115658 A1* | 5/2011 | Garreau | | H03M 1/14 |
| | | | | 341/172 |
| 2012/0218137 A1* | 8/2012 | Yoon | | H03M 1/466 |
| | | | | 341/172 |
| 2012/0280846 A1* | 11/2012 | Lin | | H03M 1/002 |
| | | | | 341/172 |
| 2013/0076553 A1* | 3/2013 | Kuo | | H03M 1/466 |
| | | | | 341/172 |
| 2013/0093609 A1* | 4/2013 | Chang | | H03M 1/462 |
| | | | | 341/110 |
| 2013/0135129 A1* | 5/2013 | Chang | | G06F 3/041 |
| | | | | 341/172 |
| 2013/0135134 A1* | 5/2013 | Lin | | H03M 1/1215 |
| | | | | 341/172 |
| 2014/0085118 A1 | 3/2014 | Tsai | | |
| 2022/0329253 A1* | 10/2022 | Lin | | H03M 1/1245 |

FOREIGN PATENT DOCUMENTS

| | | |
|---|---|---|
| TW | 201301773 A | 1/2013 |
| TW | 201414211 A | 4/2014 |

OTHER PUBLICATIONS

M. Wu, Y. Chung and H. Li, "A 12-bit 8.47-fJ/conversion-step 1-MS/s SAR ADC using capacitor-swapping technique," 2012 IEEE Asian Solid-State Circuits Conference (A-SSCC), Kobe, 2012, pp. 157-160, doi: 10.1109/IPEC.2012.6522649 ,Nov. 2012.

* cited by examiner

METHOD OF OPERATING ANALOG-TO-DIGITAL CONVERTER BY REVERSED SWITCHING TECHNIQUE AND ANALOG-TO-DIGITAL CONVERTER UTILIZING SAME

CROSS REFERENCE TO RELATED APPLICATION

This non-provisional application claims priority of Taiwan patent application No. 110120503, filed on 4 Jun. 2021, included herein by reference in its entirety.

BACKGROUND OF THE INVENTION

1. Field of the Invention

The present invention relates to electronic circuits, and in particular, to a method of operating an analog-to-digital converter.

2. Description of the Prior Art

An analog-to-digital converter (ADC) is a device for converting a continuous analog signal into a discrete digital signal. The ADC has found wide applications in audio systems, video systems, communication systems, and other various digital signal processing systems. The successive approximation register (SAR) ADC is an analog-to-digital converter that utilizes capacitor arrays for analog-to-digital conversion. The SAR ADC is low in power consumption and is suitable for use in mobile devices or portable devices. Nevertheless, the SAR ADC has a nonlinear error owing to capacitance mismatch of the capacitor arrays, leading to a reduction in accuracy.

SUMMARY OF THE INVENTION

According to an embodiment of the invention, an analog-to-digital converter includes a first capacitor array, a first selection circuit, a second capacitor array, a second selection circuit, a comparator and a control logic circuit. The first capacitor array includes a plurality of sets of capacitors, each set of capacitors in the first capacitor array comprising a first capacitor and a second capacitor. The second capacitor array includes a plurality of sets of capacitors, each set of capacitors in the second capacitor array comprising a first capacitor and a second capacitor. The first selection circuit is coupled to the first capacitor array. The second selection circuit is coupled to the second capacitor array. The comparator includes a first input terminal coupled to the first capacitor array, and a second input terminal coupled to the second capacitor array. The control logic circuit is coupled to the first selection circuit, the second selection circuit, and the comparator. The method includes in a first sampling period, the first selection circuit outputting a first reference voltage to the first capacitor in each set of capacitors in the first capacitor array and outputting a second reference voltage to the second capacitor in each set of capacitors in the first capacitor array, and the second selection circuit outputting the first reference voltage to the first capacitor in each set of capacitors in the second capacitor array and outputting the second reference voltage to the second capacitor in each set of capacitors in the second capacitor array, in a first conversion period, the comparator comparing a voltage at the first input terminal and a voltage at the second input terminal to generate a first comparison result, the first selection circuit outputting the second reference voltage to a first capacitor of a set of larger capacitors in the first capacitor array, and the second selection circuit outputting the first reference voltage to a second capacitor of a set of larger capacitors in the second capacitor array, and in a second conversion period subsequent to the first conversion period, the comparator comparing a voltage at the first input terminal and a voltage at the second input terminal to generate a second comparison result, the first selection circuit outputting the first reference voltage to a first capacitor portion of the first capacitor of the set of larger capacitors in the first capacitor array or a first capacitor portion of a second capacitor of the set of larger capacitors in the first capacitor array, and the second selection circuit outputting the second reference voltage to a first capacitor portion of a first capacitor of the set of larger capacitors in the second capacitor array or a first capacitor portion of the second capacitor of the set of larger capacitors in the second capacitor array. The first comparison result and the second comparison result are different.

According to another embodiment of the invention, an analog-to-digital converter includes a first capacitor array, a first selection circuit, a second capacitor array, a second selection circuit, a comparator and a control logic circuit. The first capacitor array includes a plurality of sets of capacitors, each set of capacitors in the first capacitor array comprising a first capacitor and a second capacitor. The second capacitor array includes a plurality of sets of capacitors, each set of capacitors in the second capacitor array comprising a first capacitor and a second capacitor. The first selection circuit is coupled to the first capacitor array. The second selection circuit is coupled to the second capacitor array. The comparator includes a first input terminal coupled to the first capacitor array, and a second input terminal coupled to the second capacitor array. The control logic circuit is coupled to the first selection circuit, the second selection circuit, and the comparator. In a first sampling period, the first selection circuit is configured to output a first reference voltage to the first capacitor in each set of capacitors in the first capacitor array and output a second reference voltage to the second capacitor in each set of capacitors in the first capacitor array, and the second selection circuit is configured to output the first reference voltage to the first capacitor in each set of capacitors in the second capacitor array and output the second reference voltage to the second capacitor in each set of capacitors in the second capacitor array. In a first conversion period, the comparator is configured to compare a voltage at the first input terminal and a voltage at the second input terminal to generate a first comparison result, the first selection circuit is configured to output the second reference voltage to a first capacitor of a set of larger capacitors in the first capacitor array, and the second selection circuit is configured to output the first reference voltage to a second capacitor of a set of larger capacitors in the second capacitor array. In a second conversion period subsequent to the first conversion period, the comparator is configured to compare a voltage at the first input terminal and a voltage at the second input terminal to generate a second comparison result, the first selection circuit is configured to output the first reference voltage to a first capacitor portion of the first capacitor of the set of larger capacitors in the first capacitor array or a first capacitor portion of a second capacitor of the set of larger capacitors in the first capacitor array, and the second selection circuit is configured to output the second reference voltage to a first capacitor portion of a first capacitor of the set of larger capacitors in the second capacitor array or a first capacitor portion of the second capacitor of the set of larger capacitors in the second capacitor array. The first comparison result and the second comparison result are different.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
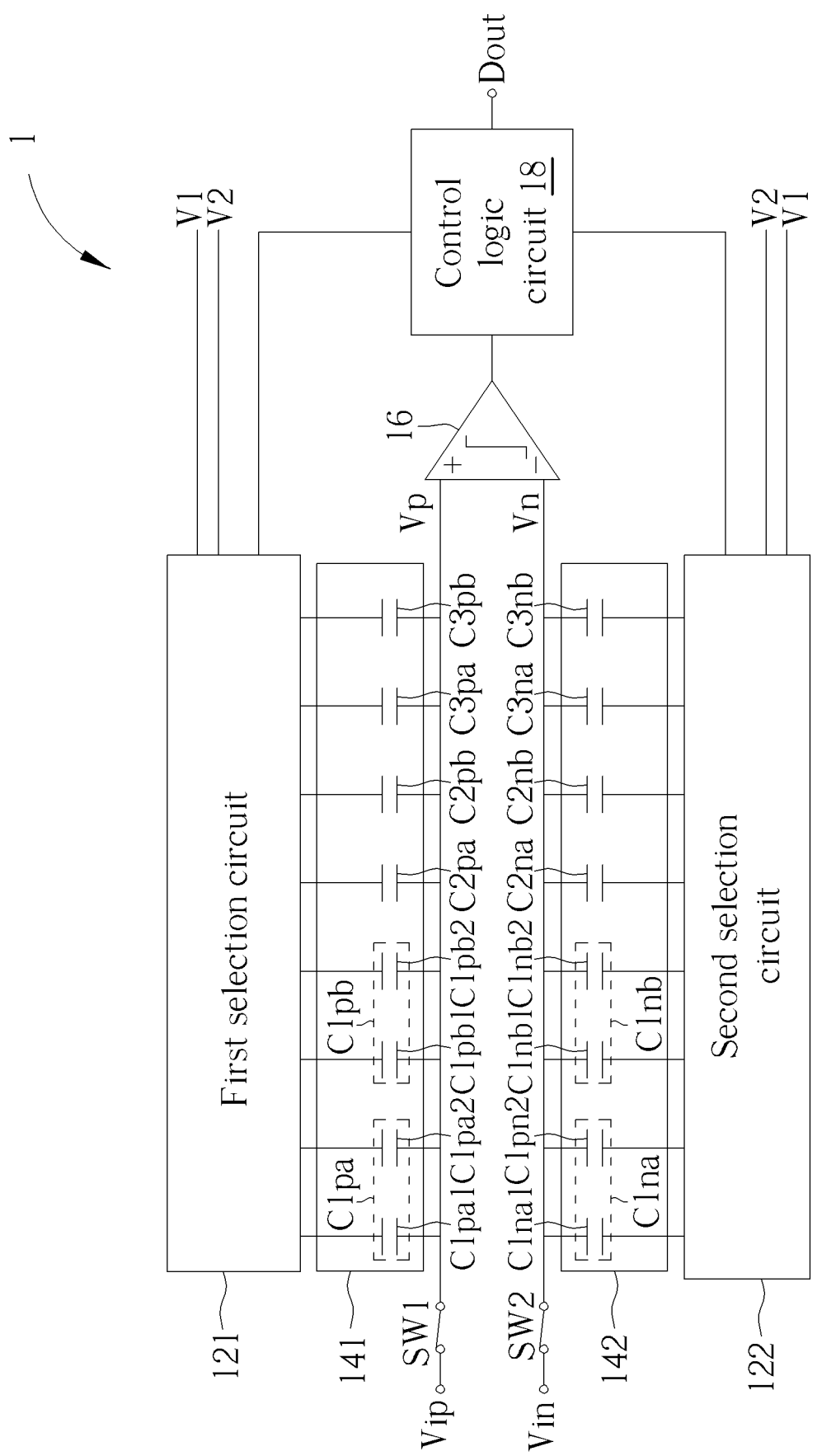
FIG. 1 is a circuit schematic of an analog-to-digital converter according to an embodiment of the present invention.

IG. 1 is a circuit schematic of an analog-to-digital converter 1 according to an embodiment of the invention. The analog-to-digital converter 1 is a 3-bit split-capacitor successive approximation register (SAR) analog-to-digital converter, and may be used to convert differential input voltages Vip, Vin into digital output data Dout according to a successive approximation method such as a binary search method. The differential input voltages Vip, Vin may be provided by a first signal source and a second signal source, respectively. The digital output data Dout may include 3 bits. The analog-to-digital converter 1 may generate a set of digital output data Dout in each operation cycle. Each operation cycle may include a sampling stage (also referred to as an acquisition stage) and a quantization stage (also referred to as a conversion stage). The analog-to-digital converter 1 may sample the differential input voltages Vip, Vin during the sampling stage to generate a pair of sample signals, and quantize the pair of sample signals during the quantization stage to generate the digital output data Dout. The quantization stage may include multiple (3) conversions to sequentially generate multiple (3) bits of the digital output data Dout. In a plurality of sampling stages, the analog-to-digital converter 1 may be reset according to two voltage settings, thereby reducing a voltage error owing to a mismatch between capacitive components, reducing an integral nonlinearity (INL) error and a differential nonlinearity (DNL) error, while providing a high-speed analog-to-digital conversion.

The analog-to-digital converter 1 may include a switch SW1 and a switch SW2, a first capacitor array 141, a first selection circuit 121, a second capacitor array 142, a second selection circuit 122, a comparator 16 and a control logic circuit 18. The first selection circuit 121 and the switch SW1 are coupled to the first capacitor array 141, and the second selection circuit 122 and the switch SW2 are coupled to the second capacitor array 142. The comparator 16 may include a first input terminal coupled to the first capacitor array 141, a second input terminal coupled to the second capacitor array 142, and an output terminal coupled to the control logic circuit 18. The control logic circuit 18 is coupled to the first selection circuit 121 and the second selection circuit 122.

The first capacitor array 141 may include three sets of capacitors, and the capacitances of the three sets of capacitors may be equal, partially equal, or different from each other, and may be modified according to design requirements. In some embodiments, the capacitances of the 3 sets of capacitors may be different. Each set of capacitors includes a first capacitor and a second capacitor, and the first capacitor and the second capacitor have substantially equal capacitance. The first set of capacitors of the first capacitor array 141 may include a first capacitor C1$pa$ and a second capacitor C1$pb$, the second set of capacitors of the first capacitor array 141 may include a first capacitor C2$pa$ and a second capacitor C2$pb$, and the third set of capacitors of the first capacitor array 141 may include a first capacitor C3$pa$ and a second capacitor C3$pb$. The first set of capacitors, the second set of capacitors, and the third set of capacitors of the first capacitor array 141 may respectively correspond to the most significant bit (MSB) to the least significant bit (LSB) of the digital output data Dout. The first capacitor C1$pa$ and the second capacitor C1$pb$ may have substantially equal capacitance of 3C, respectively, and the first set of capacitors of the first capacitor array 141 may have a capacitance of 6C. The first capacitor C2$pa$ and the second capacitor C2$pb$ may have substantial equal capacitance of 2C, respectively, and the second set of capacitors of the first capacitor array 141 may have a capacitance of 4C. The first capacitor C3$pa$ and the second capacitor C3$pb$ may have substantially equal capacitance of C, respectively, and the third set of capacitors of the first capacitor array 141 may have a capacitance of 2C. The first capacitor C1$pa$ of the first set of capacitors in the first capacitor array 141 is further divided into a first capacitor portion C1$pa$1 and a second capacitor portion C1$pa$2, and the second capacitor C1$pb$ of the first set of capacitors of the first capacitor array 141 is further divided into a first capacitor portion C1$pb$1 and a second capacitor portion C1$pb$2. Each of the capacitors C1$pa$1, C1$pa$2, C1$pb$1, C1$pb$2, C2$pa$, C2$pb$, C3$pa$ and C3$pb$ may include an upper plate and a lower plate. The upper plates of the capacitors C1$pa$1, C1$pa$2, C1$pb$1, C1$pb$2, C2$pa$, C2$pb$, C3$pa$ and C3$pb$ may be coupled to the switch SW1 and the first input terminal of the comparator 16.

Similarly, the second capacitor array 142 may include 3 sets of capacitors. The capacitances of the 3 sets of capacitors may be different. Each set of capacitors includes a first capacitor and a second capacitor, and the first capacitor and the second capacitor have substantially equal capacitance. The first set of capacitors of the second capacitor array 142 may include a first capacitor C1$na$ and a second capacitor C1$nb$, the second set of capacitors may include a first capacitor C2$na$ and a second capacitor C2$nb$, and the third set of capacitors may include a first capacitor C3$na$ and a second capacitor C3$nb$. The first set of capacitors, the second set of capacitors, and the third set of capacitors of the second capacitor array 142 may respectively correspond to the most significant bit to the least significant bit of the digital output data Dout. The first capacitor C1$na$ and the second capacitor C1$nb$ may have substantially equal capacitance of 3C, respectively, and the first set of capacitors of the second capacitor array 142 may have a capacitance of 6C. The first capacitor C2$na$ and the second capacitor C2$nb$ may have substantial equal capacitance of 2C, respectively, and the second set of capacitors of the second capacitor array 142 may have a capacitance of 4C. The first capacitor C3$na$ and the second capacitor C3$nb$ may have substantially equal capacitance of C, respectively, and the third set of capacitors of the second capacitor array 142 may have a capacitance of 2C. The first capacitor C1$na$ of the first set of capacitors of the second capacitor array 142 is further divided into a first capacitor portion C1$na$1 and a second capacitor portion C1$na$2, and the second capacitor C1$nb$ of the first set of capacitors of the second capacitor array 142 is further divided into a first capacitor portion C1$nb$1 and a second capacitor portion C1$nb$2. Each of the capacitors C1$na$1, C1$na$2, C1$nb$1, C1$nb$2, C2$na$, C2$nb$, C3$na$ and C3$nb$ may include an upper plate and a lower plate. The upper plates of the capacitors C1na1, C1na2, C1nb1, C1nb2, C2na, C2nb, C3na and C3nb may be coupled to the switch SW2 and the second input terminal of the comparator 16.

The first selection circuit 121 may receive the first reference voltage V1 and the second reference voltage V2 to configure the 3 sets of capacitors of the first capacitor array 141, and the second selection circuit 122 may receive the first reference voltage V1 and the second reference voltage V2 to configure the 3 sets of capacitors of the second capacitor array 142. In some embodiments, the first reference voltage V1 may be a supply voltage such as 1.8V, and the second reference voltage V2 may be a ground voltage such as 0V. In other embodiments, the first reference voltage V1 may be a ground voltage, and the second reference voltage V2 may be a supply voltage. The first selection circuit 121 may be coupled to the lower plates of the capacitors C1pa1, C1pa2, C1pb1, C1pb2, C2pa, C2pb, C3pa and C3pb. The second selection circuit 122 may be coupled to the lower plates of the capacitors C1na1, C1na2, C1nb1, C1nb2, C2na, C2nb, C3na and C3nb.

The first selection circuit 121 and the second selection circuit 122 may be implemented by one or more multiplexers and/or switches, but are not limited thereto. The one or more of multiplexers and/or switches of the first selection circuit 121 may receive a selection signal from the control logic circuit 18 to select one of the first reference voltage V1 and the second reference voltage V2 to output to the lower plates of the capacitors C1pa1, C1pa2, C1pb1, C1pb2, C2pa, C2pb, C3pa and C3pb. The one or more of multiplexers and/or switches of the second selection circuit 122 may receive a selection signal from the control logic circuit 18 to select one of the first reference voltage V1 and the second reference voltage V2 to output to the lower plates of the capacitors C1na1, C1na2, C1nb1, C1nb2, C2na, C2nb, C3na and C3nb. For brevity, in the following paragraphs, the references of the first selection circuit 121 outputting selected voltages to the first capacitor array 141 represent that the first selection circuit 121 outputs the selected voltages to the lower plates of the first capacitor array 141, and the references of the second selection circuit 122 outputting selected voltages to the second capacitor array 142 represent that the second selection circuit 122 outputs the selected voltages to the lower plates of the second capacitor array 142.

During the sampling stage, the switch SW1 and the switch SW2 may be turned on, and the first capacitor array 141 and the second capacitor array 142 may sample the differential input voltages Vip, Vin, respectively. In the sampling period, the first selection circuit 121 and the second selection circuit 122 may output the voltage in the first voltage setting or the second voltage setting to the capacitors C1pa1, C1pa2, C1pb1, C1pb2, C2pa, C2pb, C3pa, C3pb and capacitors C1na1, C1na2, C1nb1, C1nb2, C2na, C2nb, C3na, C3nb. Table 1 and Table 2 respectively show the first voltage setting and the second voltage setting:

TABLE 1

| Capacitor | C1pa1 | C1pa2 | C1pb1 | C1pb2 | C2pa | C2pb | C3pa | C3pb |
|---|---|---|---|---|---|---|---|---|
| Lower plate voltage | V1 | V1 | V2 | V2 | V1 | V2 | V1 | V2 |
| Capacitor | C1na1 | C1na2 | C1nb1 | C1nb2 | C2na | C2nb | C3na | C3nb |
| Lower plate voltage | V1 | V1 | V2 | V2 | V1 | V2 | V1 | V2 |

TABLE 2

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | V1 | V1 | V2 | V1 | V2 | V1 |
| Capacitor | C1na1 | C1na2 | C1nb1 | C1nb2 | C2na | C2nb | C3na | C3nb |
| Lower plate voltage | V2 | V2 | V1 | V1 | V2 | V1 | V2 | V1 |

In some embodiments, during sampling, the first selection circuit 121 may output the corresponding voltages in the first voltage setting to the lower plates of the capacitors C1pa1, C1pa2, C1pb1, C1pb2, C2pa, C2pb, C3pa and C3pb, and the switch SW1 may be turned on to transfer the differential input voltage Vip to the upper plates of the capacitors C1pa1, C1pa2, C1pb1, C1pb2, C2pa, C2pb, C3pa and C3pb, so as to establish a voltage Vp at the first input terminal of the comparator 16, and the second selection circuit 122 may output the corresponding voltages in the first voltage setting to the lower plates of the capacitors C1na1, C1na2, C1nb1, C1nb2, C2na, C2nb, C3na and C3nb, and the switch SW2 may be turned on to transfer the differential input voltage Vin to the upper plates of the capacitors C1na1, C1na2, C1nb1, C1nb2, C2na, C2nb, C3na and C3nb, so as to establish a voltage Vn at the second input terminal of the comparator 16. In other embodiments, during sampling, the first selection circuit 121 may output the corresponding voltages in the second voltage setting to the lower plates of the capacitors C1pa1, C1pa2, C1pb1, C1pb2, C2*pa*, C2*pb*, C3*pa* and C3*pb*, and the switch SW1 may be turned on to transfer the differential input voltage Vip to the upper plates of the capacitors C1*pa*1, C1*pa*2, C1*pb*1, C1*pb*2, C2*pa*, C2*pb*, C3*pa* and C3*pb*, so as to establish a voltage Vp, and the second selection circuit 122 may output the corresponding voltages in the second voltage setting to the lower plates of the capacitors C1*na*1, C1*na*2, C1*nb*1, C1*nb*2, C2*na*, C2*nb*, C3*na* and C3*nb*, and the switch SW2 may be turned on to transfer the differential input voltage Vin to the upper plates of the capacitors C1*na*1, C1*na*2, C1*nb*1, C1*nb*2, C2*na*, C2*nb*, C3*na* and C3*nb*, so as to establish a voltage Vn.

In the quantization stage, the analog-to-digital converter 1 may perform 3 conversions to generate the 3-bit digital output data Dout, the comparator 16 may compare the voltages Vp and Vn to generate 3 comparison results, and the control logic circuit 18 may store each comparison result as each bit of the digital output data Dout, and set the first selection circuit 121 and the second selection circuit 122 according to each comparison result to update the voltages Vp and Vn. The comparison result may be binary "0" or binary "1". For example, when converting the most significant bit, if the voltage Vp is greater than the voltage Vn, the comparator 16 may generate a binary "1" as the comparison result, and the control logic circuit 18 may store the binary "1" as the most significant bit, set the first selection circuit 121 to output the ground voltage to the lower plates of the capacitors C1*pa*1, C1*pa*2, C1*pb*1 and C1*pb*2 to pull down the voltage Vp, and set the second selection circuit 122 to output the supply voltage to the lower plates of the capacitors C1*na*1, C1*na*2, C1*nb*1 and C1*nb*2 to pull up the voltage Vn. The updated voltage Vp will be less than the previous voltage Vp, and the updated voltage Vn will be higher than the previous voltage Vn. If the voltage Vp is less than the voltage Vn, the comparator 16 may generate a binary "0" as the comparison result, and the control logic circuit 18 may store the binary "0" as the most significant bit, set the first selection circuit 121 to output the supply voltage to the lower plates of the capacitors C1*pa*1, C1*pa*2, C1*pb*1 and C1*pb*2 to pull up the voltage Vp, and set the second selection circuit 122 to output the ground voltage to the lower plates of the capacitors C1*na*1, C1*na*2, C1*nb*1 and C1*nb*2 to pull down the voltage Vn. The updated voltage Vp will be higher than the previous voltage Vp, and the updated voltage Vn will be less than the previous voltage Vn. The analog-to-digital converter 1 may sequentially compare and update the voltages Vp and Vn to generate the 3-bit of the digital output data Dout, and output the digital output data Dout for the subsequent use.

Figure 2:
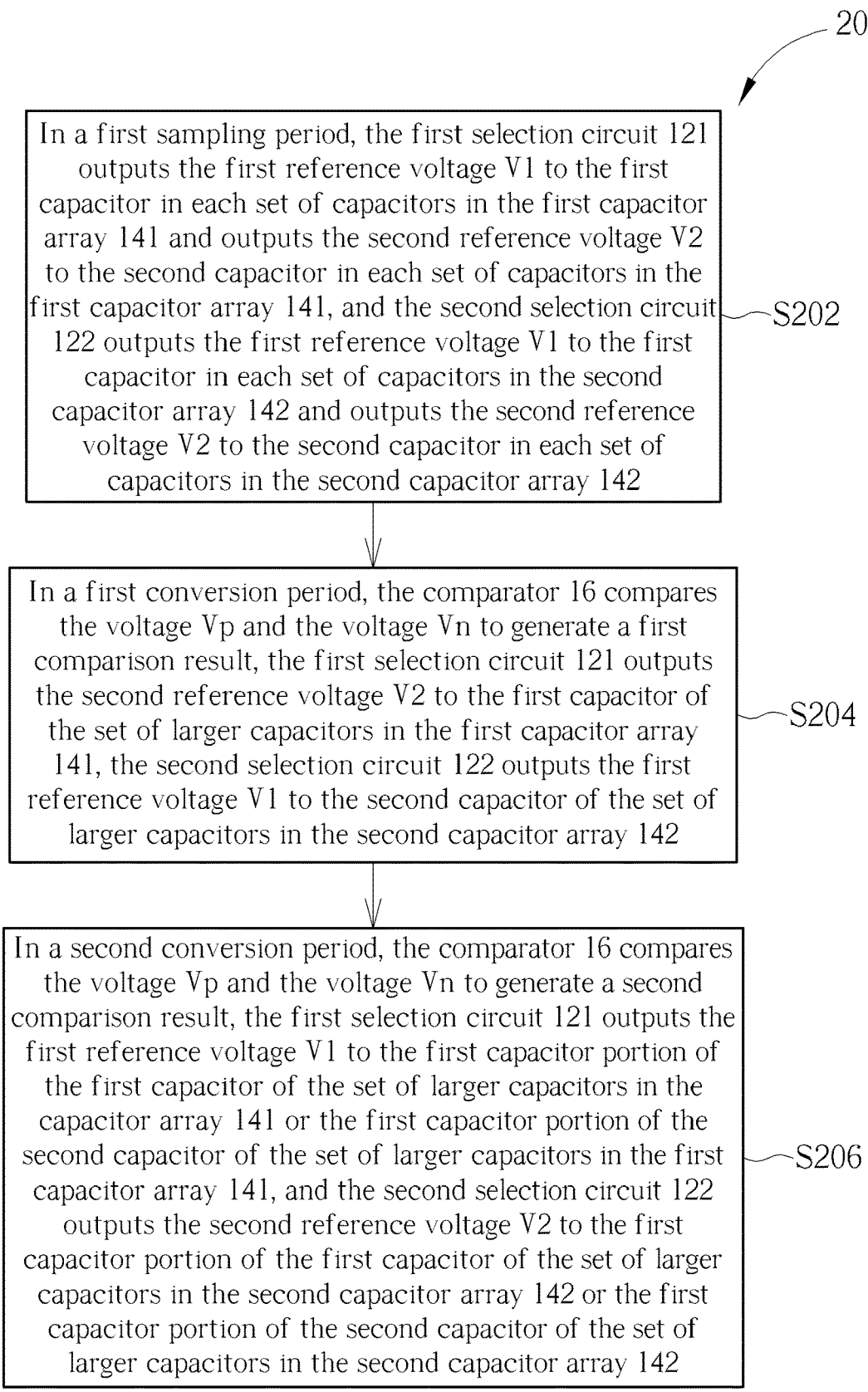
FIG. 2 is a flowchart of a method of operating the analog-to-digital converter in FIG. 1.

FIG. 2 is a flowchart of a method 200 of operating the analog-to-digital converter 1. The method 200 includes Steps S202 to S206. Step S202 is used to reset the first capacitor array 141 and the second capacitor array 142 in the sampling period. Steps S204, and S206 are used to switch the first capacitor array 141 and the second capacitor array 142 in the conversion period to generate the digital output data Dout. Any reasonable Step change or adjustment is within the scope of the disclosure. Steps S202 to S206 are detailed as follows:

Step S202: In a first sampling period, the first selection circuit 121 outputs the first reference voltage V1 to the first capacitor in each set of capacitors in the first capacitor array 141 and outputs the second reference voltage V2 to the second capacitor in each set of capacitors in the first capacitor array 141, and the second selection circuit 122 outputs the first reference voltage V1 to the first capacitor in each set of capacitors in the second capacitor array 142 and outputs the second reference voltage V2 to the second capacitor in each set of capacitors in the second capacitor array 142;

Step S204: In a first conversion period, the comparator 16 compares the voltage Vp and the voltage Vn to generate a first comparison result, the first selection circuit 121 outputs the second reference voltage V2 to the first capacitor of the set of larger capacitors in the first capacitor array 141, the second selection circuit 122 outputs the first reference voltage V1 to the second capacitor of the set of larger capacitors in the second capacitor array 142;

Step S206: In a second conversion period, the comparator 16 compares the voltage Vp and the voltage Vn to generate a second comparison result, the first selection circuit 121 outputs the first reference voltage V1 to the first capacitor portion of the first capacitor of the set of larger capacitors in the capacitor array 141 or the first capacitor portion of the second capacitor of the set of larger capacitors in the first capacitor array 141, and the second selection circuit 122 outputs the second reference voltage V2 to the first capacitor portion of the first capacitor of the set of larger capacitors in the second capacitor array 142 or the first capacitor portion of the second capacitor of the set of larger capacitors in the second capacitor array 142.

In Step S206, the first comparison result and the second comparison result are different. In some embodiments, the first comparison result may indicate that the voltage Vp is greater than the voltage Vn and the second comparison result may indicate that the voltage Vp is less than the voltage Vn, and the first reference voltage V1 may be greater than the second reference voltage V2. In other embodiments, the first comparison result may indicate that the voltage Vp is less than the voltage Vn and the second comparison result may indicate that the voltage Vp is greater than the voltage Vn, and the first reference voltage V1 may be less than the second reference voltage V2. The method 200 is explained as follows with reference to the analog-to-digital converter 1.

In the first sampling period, the first selection circuit 121 and the second selection circuit 122 may respectively apply the first voltage settings in Table 1 to reset the first capacitor array 141 and the second capacitor array 142 (Step S202). When the first reference voltage V1 is the supply voltage and the second reference voltage V2 is the ground voltage, if the first comparison result indicates that the voltage Vp is greater than the voltage Vn in the first conversion period, the first selection circuit 121 outputs the second reference voltage V2 to the first capacitor portion C1*pa*1 and the second capacitor portion C1*pa*2 of the first capacitor C1*pa* of the first set of capacitors in the first capacitor array 141, and the second selection circuit 122 outputs the first reference voltage V1 to the first capacitor portion C1*nb*1 and the second capacitor portion C1*nb*2 of the second capacitor C1*nb* of the first set of capacitors in the second capacitor array 142, as indicated in Table 3 (Step S204):

TABLE 3

| Capacitor | C1pa1 | C1pa2 | C1pb1 | C1pb2 | C2pa | C2pb | C3pa | C3pb |
|---|---|---|---|---|---|---|---|---|
| Lower plate voltage | "V2" | "V2" | V2 | V2 | V1 | V2 | V1 | V2 |

| Capacitor | C1na1 | C1na2 | C1nb1 | C1nb2 | C2na | C2nb | C3na | C3nb |
|---|---|---|---|---|---|---|---|---|
| Lower plate voltage | V1 | V1 | "V1" | "V1" | V1 | V2 | V1 | V2 |

If the second comparison result indicates that the voltage Vp is less than the voltage Vn in the second conversion period, the first selection circuit 121 outputs the first reference voltage V1 to the first capacitor portion C1pa1 of the first capacitor C1pa of the first set of capacitors in the first capacitor array 141, so as to switch the first capacitor portion C1pa1 back to the reset value thereof (V1), and the second selection circuit 122 outputs the second reference voltage V2 to the first capacitor portion C1nb1 of the second capacitor C1nb of the first set of capacitors in the second capacitor array 142, so as to switch the first capacitor portion C1nb1 back to the reset value thereof (V2), as indicated in Table 4 (Step S206):

TABLE 4

| Capacitor | C1pa1 | C1pa2 | C1pb1 | C1pb2 | C2pa | C2pb | C3pa | C3pb |
|---|---|---|---|---|---|---|---|---|
| Lower plate voltage | "V1" | V2 | V2 | V2 | V1 | V2 | V1 | V2 |

| Capacitor | C1na1 | C1na2 | C1nb1 | C1nb2 | C2na | C2nb | C3na | C3nb |
|---|---|---|---|---|---|---|---|---|
| Lower plate voltage | V1 | V1 | "V2" | V1 | V1 | V2 | V1 | V2 |

In other embodiments, if the second comparison result indicates that the voltage Vp is less than the voltage Vn in the second conversion period, the first selection circuit 121 outputs the first reference voltage V1 to the first capacitor portion C1pb1 of the second capacitor C1pb of the first set of capacitors in the first capacitor array 141, and the second selection circuit 122 outputs the second reference voltage V2 to the first capacitor portion C1na1 of the first capacitor C1na of the first set of capacitors in the second capacitor array 142, as indicated in Table 5 (Step S206):

first selection circuit 121 outputs the second reference voltage V2 to the first capacitor portion C1pa1 and the second capacitor portion C1pa2 of the first capacitor C1pa of the first set of capacitors in the first capacitor array 141, and the second selection circuit 122 outputs the first reference voltage V1 to the first capacitor portion C1nb1 and the second capacitor portion C1nb2 of the second capacitor C1nb of the first set of capacitors in the second capacitor array 142, as indicated in Table 3 (Step S204): If the second comparison result indicates that the voltage Vp is greater than the voltage Vn in the second conversion period, the first selection circuit 121 outputs the first reference voltage V1 to the first capacitor portion C1pa1 of the first capacitor C1pa of the first set of capacitors in the first capacitor array 141, and the second selection circuit 122 outputs the second reference voltage V2 to the first capacitor portion C1nb1 of the second capacitor C1nb of the first set of capacitors in the second capacitor array 142, as indicated in Table 4 (Step S206): In other embodiments, if the second comparison result indicates that the voltage Vp is greater than the voltage Vn in the second conversion period, the first selection circuit 121 outputs the first reference voltage V1 to the first

TABLE 5

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | "V1" | V2 | V1 | V2 | V1 | V2 |

| Capacitor | C1na1 | C1na2 | C1nb1 | C1nb2 | C2na | C2nb | C3na | C3nb |
|---|---|---|---|---|---|---|---|---|
| Lower plate voltage | "V2" | V1 | V1 | V1 | V1 | V2 | V1 | V2 |

When the first reference voltage V1 is the ground voltage and the second reference voltage V2 is the supply voltage, if the first comparison result indicates that the voltage Vp is less than the voltage Vn in the first conversion period, the capacitor portion C1pb1 of the second capacitor C1pb of the first set of capacitors in the first capacitor array 141, and the second selection circuit 122 outputs the second reference voltage V2 to the first capacitor portion C1na1 of the first capacitor C1*na* of the first set of capacitors in the second capacitor array 142, as indicated in Table 5 (Step S206).

In other embodiments, in the first sampling period, the first selection circuit 121 and the second selection circuit 122 respectively apply the second voltage setting in Table 2 to reset the first capacitor array 141 and the second capacitor array 142 (Step S202). When the first reference voltage V1 is the supply voltage and the second reference voltage V2 is the ground voltage, if the first comparison result indicates that the voltage Vp is greater than the voltage Vn in the first conversion period, the first selection circuit 121 outputs the second reference voltage V2 to the first capacitor portion C1*pb*1 and the second capacitor portion C1*pb*2 of the second capacitor C1*pb* of the first set of capacitors in the first capacitor array 141, and the second selection circuit 122 outputs the first reference voltage V1 to the first capacitor portion C1*na*1 and the second capacitor portion C1*na*2 of the first capacitor C1*na* of the first set of capacitors in the second capacitor array 142, as indicated in Table 6 (Step S204):

TABLE 6

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | "V2" | "V2" | V2 | V1 | V2 | V1 |
| Capacitor | C1na1 | C1na2 | C1nb1 | C1nb2 | C2na | C2nb | C3na | C3nb |
| Lower plate voltage | "V1" | "V1" | V1 | V1 | V2 | V1 | V2 | V1 |

In the second conversion period, if the second comparison result indicates that the voltage Vp is less than the voltage Vn, the first selection circuit 121 outputs the first reference voltage V1 to the first capacitor portion C1*pb*1 of the second capacitor C1*pb* of the first set of capacitors in the first capacitor array 141, so as to switch the first capacitor portion C1*pb*1 back to the reset value thereof (V1), and the second selection circuit 122 outputs the second reference voltage V2 to the first capacitor portion C1*na*1 of the first capacitor C1*na* of the first set of capacitors in the second capacitor array 142, so as to switch the first capacitor portion C1*na*1 back to the reset value thereof (V2), as indicated in Table 7 (Step S206):

TABLE 7

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | "V1" | V2 | V2 | V1 | V2 | V1 |
| Capacitor | C1na1 | C1na2 | C1nb1 | C1nb2 | C2na | C2nb | C3na | C3nb |
| Lower plate voltage | "V2" | V1 | V1 | V1 | V2 | V1 | V2 | V1 |

In other embodiments, if the second comparison result indicates that the voltage Vp is less than the voltage Vn in the second conversion period, the first selection circuit 121 outputs the first reference voltage V1 to the first capacitor portion C1pa1 of the first capacitor C1pa of the first set of capacitors in the first capacitor array 141, and the second selection circuit 122 outputs the second reference voltage V2 to the first capacitor portion C1nb1 of the second capacitor C1nb of the first set of capacitors in the second capacitor array 142, as indicated in Table 8 (Step S206).

TABLE 8

| Capacitor | C1pa1 | C1pa2 | C1pb1 | C1pb2 | C2pa | C2pb | C3pa | C3pb |
|---|---|---|---|---|---|---|---|---|
| Lower plate voltage | "V1" | V2 | V2 | V2 | V2 | V1 | V2 | V1 |

| Capacitor | C1na1 | C1na2 | C1nb1 | C1nb2 | C2na | C2nb | C3na | C3nb |
|---|---|---|---|---|---|---|---|---|
| Lower plate voltage | V1 | V1 | "V2" | V1 | V2 | V1 | V2 | V1 |

When the first reference voltage V1 is the ground voltage and the second reference voltage V2 is the supply voltage, if the first comparison result indicates that the voltage Vp is less than the voltage Vn in the first conversion period, the first selection circuit 121 outputs the second reference voltage V2 to the first capacitor portion C1pb 1 and the second capacitor portion C1pb2 of the second capacitor C1pb of the first set of capacitors in the first capacitor array 141, and the second selection circuit 122 outputs the first reference voltage V1 to the first capacitor portion C1na1 and the second capacitor portion C1na2 of the first capacitor C1na of the first set of capacitors in the second capacitor array 142, as indicated in Table 6 (Step S204): If the second comparison result indicates that the voltage Vp is greater than the voltage Vn in the second conversion period, the first selection circuit 121 outputs the first reference voltage V1 to the first capacitor portion C1pa1 of the second capacitor C1pb of the first set of capacitors in the first capacitor array 141, and the second selection circuit 122 outputs the second reference voltage V2 to the first capacitor portion C1na1 of the first capacitor C1na of the first set of capacitors in the second capacitor array 142, as indicated in Table 7 (Step S206). In other embodiments, if the second comparison result indicates that the voltage Vp is greater than the voltage Vn in the second conversion period, the first selection circuit 121 outputs the first reference voltage V1 to the first capacitor portion C1pa1 of the first capacitor C1pa of the first set of capacitors in the first capacitor array 141, and the second selection circuit 122 outputs the second reference voltage V2 to the first capacitor portion C1nb1 of the second capacitor C1nb of the first set of capacitors in the second capacitor array 142, as indicated in Table 8 (Step S206).

The first sampling period may belong to the first sampling stage, the first conversion period and the second conversion period may belong to the first quantization stage, and the first sampling stage and the first quantization stage may belong to the first operation cycle. During the first operation cycle, the analog-to-digital converter 1 may sequentially generate 3 comparison results, and output digital output data Dout according to the 3 comparison results. In the second operation cycle subsequent to the first operation cycle, the analog-to-digital converter 1 may repeat steps S202 to S206 to further generate three comparison results, and output the subsequent digital output data Dout according to the generated three comparison results.

The second operation cycle may include a second sampling stage and a second quantization stage, the second sampling stage may include a second sampling period, and the second quantization stage may include a third conversion period and a fourth conversion period thereafter. The third conversion period may correspond to the first conversion period and may be used to generate a higher corresponding bit of the digital output data Dout, and the fourth conversion period may correspond to the second conversion period and may be used to generate a lower corresponding bit of the digital output data Dout. The second conversion period and the fourth conversion period are not limited to be immediately after the first conversion period and the third conversion period, respectively. In some embodiments, when the analog-to-digital converter 1 performs the 3-bit conversion, a similar approach may be adopted to switch the second capacitor portion of the first capacitor or the second capacitor portion of the second capacitor of the first set of capacitors in the first capacitor array 141 and the second capacitor array 142, i.e., switching the capacitor portions C1pa2, C1pb2, C1na2, C1nb2. In other embodiments, if the capacitor arrays are configured into a larger number of bits (e.g., 10-bits), the first capacitor and the second capacitor of a larger set of capacitors of the first capacitor array 141 and the second capacitor array 142 may be split into a plurality of capacitor portions, respectively. The respective capacitances of the plurality of capacitor portions are substantially equal to the capacitances of one or more of smaller sets of capacitors, and the method 200 may be used to switch back a portion of the larger set of the capacitors if the current comparison result is different from the comparison result of a more significant bit when performing a conversion for a less significant bit.

In some embodiments, in a second sampling period, the first selection circuit 121 outputs the first reference voltage V1 to the first capacitor in each set of capacitors in the first capacitor array 141 and outputs the second reference voltage V2 to the second capacitor in each set of capacitors in the first capacitor array 141, and the second selection circuit 122 outputs the first reference voltage V1 to the first capacitor in each set of capacitors in the second capacitor array 142 and outputs the second reference voltage V2 to the second capacitor in each set of capacitors in the second capacitor array 142, as indicated in Table 1. In the third conversion period, the comparator 16 compares a voltage at the first input terminal and a voltage at the second input terminal to generate a third comparison result, the first selection circuit 121 outputs the second reference voltage V2 to the first capacitor C1pa of the set of larger capacitors in the first capacitor array 141, and the second selection circuit 122 outputs the first reference voltage V1 to the second capacitor C1nb of a set of larger capacitors in the second capacitor array 142, as indicated in Table 3. In the fourth conversion period, the comparator 16 compares a voltage at the first input terminal and a voltage at the second input terminal to generate a fourth comparison result. The third comparison result and the fourth comparison result may be different.

If the comparison results in the second conversion period and the fourth conversion period are different from the comparison results in the first conversion period and the third conversion period, respectively, the analog-to-digital converter 1 may adopt a fixed switching method to switch the first capacitor array 141 and the second capacitor array 142 in the second conversion period and the fourth conversion period. For example, the analog-to-digital converter 1 may adopt one of Table 4, Table 5, Table 7 and Table 8 to switch the first capacitor array 141 and the second capacitor array 142.

In some embodiments, the analog-to-digital converter 1 may switch the first capacitor array 141 and the second capacitor array 142 in alternate switching patterns, for example, adopting Table 4 and Table 5 alternately or adopting Table 7 and Table 8 alternately to switch the first capacitor array 141 and the second capacitor array 142.

In other embodiments, the analog-to-digital converter 1 may output the voltage settings in Table 4 and Table 5 to the first capacitor array 141 and the second capacitor array 142 according to a uniform random sequence, or output the voltage settings in Table 7 and Table 8 to the first selection circuit 141 and the second selection circuit 142 according to a uniform random sequence. The uniform random sequence has substantially equal probability of outputting the voltage settings of Table 4 and Table 5, or substantially equal probability of outputting the voltage settings of Table 7 and Table 8.

In other embodiments, the analog-to-digital converter 1 may output the voltage settings in Table 4 and Table 5 to the first capacitor array 141 and the second capacitor array 142 according to a predetermined uniform sequence, or output the voltage settings in Table 7 and Table 8 to the first selection circuit 141 and the second selection circuit 142 according to a predetermined uniform sequence. The predetermined uniform sequence may be non-alternating and non-random, and has substantially equal probability of outputting the voltage settings of Table 4 and Table 5, or substantially equal probability of outputting the voltage settings of Table 7 and Table 8. For example, a predetermine uniform sequence may include N quantization stages of outputting the voltage settings of Table 4 to the first capacitor array 141 and the second capacitor array 142, followed by N quantization stages of outputting the voltage settings of Table 5 to the first capacitor array 141 and the second capacitor array 142. In other examples, which of the voltage settings in Table 4 or Table 5 is used in the predetermine uniform sequence to switch the first capacitor array 141 and the second capacitor array 142 in the current conversion period may be determined by whether switching is performed in the corresponding conversion period of the previous quantization stage.

In some embodiments, in the second conversion period, the first selection circuit 121 outputs the first reference voltage V1 to the first capacitor portion C1pa1 of the first capacitor C1pa of the set of larger capacitors in the capacitor array 141, and the second selection circuit 122 outputs the second reference voltage V2 to the first capacitor portion C1nb1 of the second capacitor C1nb of the set of larger capacitors in the second capacitor array 142, as indicated in Table 4. In the fourth conversion period, the first selection circuit 121 outputs the first reference voltage V1 to the first capacitor portion C1pb1 of the second capacitor C1pb of the set of larger capacitors in the first capacitor array 141, and the second selection circuit 122 outputs the second reference voltage V2 to the first capacitor portion C1na1 of the first capacitor C1na of the set of larger capacitors in the second capacitor array 142, as indicated in Table 5.

In other embodiments, in the second conversion period, the first selection circuit 121 outputs the first reference voltage V1 to the first capacitor portion C1pb1 of the second capacitor C1pb of the set of larger capacitors in the capacitor array 141, and the second selection circuit 122 outputs the second reference voltage V2 to the first capacitor portion C1na1 of the first capacitor C1na of the set of larger capacitors in the second capacitor array 142, as indicated in Table 5. In the fourth conversion period, the first selection circuit 121 outputs the first reference voltage V1 to the first capacitor portion C1pa1 of the first capacitor C1pa of the set of larger capacitors in the first capacitor array 141, and the second selection circuit 122 outputs the second reference voltage V2 to the first capacitor portion C1nb1 of the second capacitor C1nb of the set of larger capacitors in the second capacitor array 142, as indicated in Table 4.

In other embodiments, in the second conversion period, the first selection circuit 121 outputs the first reference voltage V1 to the first capacitor portion C1pb1 of the second capacitor C1pb of the set of larger capacitors in the capacitor array 141, and the second selection circuit 122 outputs the second reference voltage V2 to the first capacitor portion C1nb1 of the second capacitor C1nb of the set of larger capacitors in the second capacitor array 142, as indicated in Table 9. In the fourth conversion period, the first selection circuit 121 outputs the first reference voltage V1 to the first capacitor portion C1pa1 of the first capacitor C1pa of the set of larger capacitors in the first capacitor array 141, and the second selection circuit 122 outputs the second reference voltage V2 to the first capacitor portion C1na1 of the first capacitor C1na of the set of larger capacitors in the second capacitor array 142, as indicated in Table 10:

TABLE 9

| Capacitor | C1pa1 | C1pa2 | C1pb1 | C1pb2 | C2pa | C2pb | C3pa | C3pb |
|---|---|---|---|---|---|---|---|---|
| Lower plate voltage | V2 | V2 | "V1" | V2 | V1 | V2 | V1 | V2 |

| Capacitor | C1na1 | C1na2 | C1nb1 | C1nb2 | C2na | C2nb | C3na | C3nb |
|---|---|---|---|---|---|---|---|---|
| Lower plate voltage | V1 | V1 | "V2" | V1 | V1 | V2 | V1 | V2 |

TABLE 10

| Capacitor | C1pa1 | C1pa2 | C1pb1 | C1pb2 | C2pa | C2pb | C3pa | C3pb |
|---|---|---|---|---|---|---|---|---|
| Lower plate voltage | "V1" | V2 | V2 | V2 | V1 | V2 | V1 | V2 |

| Capacitor | C1na1 | C1na2 | C1nb1 | C1nb2 | C2na | C2nb | C3na | C3nb |
|---|---|---|---|---|---|---|---|---|
| Lower plate voltage | "V2" | V1 | V1 | V1 | V1 | V2 | V1 | V2 |

In other embodiments, in the second conversion period, the first selection circuit 121 outputs the first reference voltage V1 to the first capacitor portion C1pa1 of the first capacitor C1pa of the set of larger capacitors in the capacitor array 141, and the second selection circuit 122 outputs the second reference voltage V2 to the first capacitor portion C1na1 of the first capacitor C1na of the set of larger capacitors in the second capacitor array 142, as indicated in Table 10. In the fourth conversion period, the first selection circuit 121 outputs the first reference voltage V1 to the first capacitor portion C1pb1 of the second capacitor C1pb of the set of larger capacitors in the first capacitor array 141, and the second selection circuit 122 outputs the second reference voltage V2 to the first capacitor portion C1nb1 of the second capacitor C1nb of the set of larger capacitors in the second capacitor array 142, as indicated in Table 9.

The method 200 adopts a technique of reversed-switching a portion a larger capacitor to reduce the differential non-linearity error and the integral nonlinearity error owing to the capacitance mismatch between the different sets of capacitors in the first capacitor array 141 and the second capacitor array 142.

In some embodiments, if the first capacitor array 141 and the second capacitor array 142 are both 10-bit capacitor arrays, when each set of capacitors has a standard deviation of 2% random tolerance, in the second conversion period and other subsequent conversion periods, the method 200 adopts the method to operate the set of larger capacitors to reduce the differential nonlinearity error from 0.37LSB to 0.31LSB, and reduce the integral nonlinearity error from 0.82LSB to 0.8LSB. In other embodiments, when the first capacitor portion of the first capacitor of the set of larger capacitors and the first capacitor portion of the second capacitor of the set of larger capacitors are switched in a uniform random sequence or an alternating sequence during the second conversion period, the differential nonlinearity error will be reduced from 0.37LSB to 0.21LSB, and the integral nonlinearity error will be reduced from 0.82LSB to 0.48LSB The present invention is not limited to the 3-bit SAR ADC in the embodiment, and those skilled in the art may also apply the methods 200 to SAR ADCs of other sizes according to the principle of the present invention. The analog-to-digital converter 1 and the methods 200 reset the first capacitor arrays 141 and the second capacitor arrays 142 using a reversed-switching technique, reducing the differential non-linearity error and integral non-linearity error owing to the capacitance mismatch between the same set of capacitors or different sets of capacitors, significantly enhancing the linearity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating an analog-to-digital converter, the analog-to-digital converter comprising a first capacitor array, a first selection circuit, a second capacitor array, a second selection circuit, a comparator and a control logic circuit, the first capacitor array comprising a plurality of sets of capacitors, each set of capacitors in the first capacitor array comprising a first capacitor and a second capacitor, the second capacitor array comprising a plurality of sets of capacitors, each set of capacitors in the second capacitor array comprising a first capacitor and a second capacitor, the first selection circuit being coupled to the first capacitor array, the second selection circuit being coupled to the second capacitor array, the comparator comprising a first input terminal coupled to the first capacitor array, and a second input terminal coupled to the second capacitor array, the control logic circuit being coupled to the first selection circuit, the second selection circuit, and the comparator, the method comprising:

in a first sampling period, the first selection circuit outputting a first reference voltage to the first capacitor in each set of capacitors in the first capacitor array and output a second reference voltage to the second capacitor in each set of capacitors in the first capacitor array, and the second selection circuit outputting the first reference voltage to the first capacitor in each set of capacitors in the second capacitor array and output the second reference voltage to the second capacitor in each set of capacitors in the second capacitor array;

in a first conversion period, the comparator comparing a voltage at the first input terminal and a voltage at the second input terminal to generate a first comparison result, the first selection circuit outputting the second reference voltage to a first capacitor of a set of larger capacitors in the first capacitor array, and the second selection circuit outputting the first reference voltage to a second capacitor of a set of larger capacitors in the second capacitor array; and in a second conversion period subsequent to the first conversion period, the comparator comparing a voltage at the first input terminal and a voltage at the second input terminal to generate a second comparison result, the first selection circuit outputting the first reference voltage to a first capacitor portion of the first capacitor of the set of larger capacitors in the first capacitor array or a first capacitor portion of a second capacitor of the set of larger capacitors in the first capacitor array, and the second selection circuit outputting the second reference voltage to a first capacitor portion of a first capacitor of the set of larger capacitors in the second capacitor array or a first capacitor portion of the second capacitor of the set of larger capacitors in the second capacitor array;

wherein the first comparison result and the second comparison result are different.

2. The method of claim 1, wherein:

the first comparison result indicates that the voltage at the first input terminal of the comparator is greater than the voltage at the second input terminal of the comparator;

the second comparison result indicates that the voltage at the first input terminal of the comparator is less than the voltage at the second input terminal of the comparator; and the first reference voltage is greater than the second reference voltage.

3. The method of claim 1, wherein:

the first comparison result indicates that the voltage at the first input terminal of the comparator is less than the voltage at the second input terminal of the comparator;

the second comparison result indicates that the voltage at the first input terminal of the comparator is greater than the voltage at the second input terminal of the comparator; and the first reference voltage is less than the second reference voltage.

4. The method of claim 1, wherein:

a capacitance of the first capacitor portion of the first capacitor of the set of larger capacitors of the first capacitor array is substantially equal to a capacitance of a first capacitor of a set of smaller capacitors of the first capacitor array;

a capacitance of the first capacitor portion of the second capacitor of the set of larger capacitors of the first capacitor array is substantially equal to the capacitance of the first capacitor of the set of smaller capacitors of the first capacitor array;

a capacitance of the first capacitor portion of the first capacitor of the set of larger capacitors of the second capacitor array is substantially equal to a capacitance of a first capacitor of a set of smaller capacitors of the second capacitor array; and a capacitance of the first capacitor portion of the second capacitor of the set of larger capacitors of the second capacitor array is substantially equal to the capacitance of the first capacitor of the set of smaller capacitors of the second capacitor array.

5. The method of claim 1, further comprising:

in a second sampling period, the first selection circuit outputting the first reference voltage to the first capacitor in each set of capacitors in the first capacitor array and outputting the second reference voltage to the second capacitor in each set of capacitors in the first capacitor array, and the second selection circuit outputting the first reference voltage to the first capacitor in each set of capacitors in the second capacitor array and outputting the second reference voltage to the second capacitor in each set of capacitors in the second capacitor array;

in a third conversion period, the comparator comparing a voltage at the first input terminal and a voltage at the second input terminal to generate a third comparison result, the first selection circuit outputting the second reference voltage to the first capacitor of the set of larger capacitors in the first capacitor array, and the second selection circuit outputting the first reference voltage to the second capacitor of a set of larger capacitors in the second capacitor array; and in a fourth conversion period subsequent to the third conversion period, the comparator comparing a voltage at the first input terminal and a voltage at the second input terminal to generate a fourth comparison result, if the first selection circuit outputs the first reference voltage to the first capacitor portion of the first capacitor of the set of larger capacitors in the first capacitor array in the second conversion period, the first selection circuit outputting the first reference voltage to the first capacitor portion of the second capacitor of the set of larger capacitors in the first capacitor array, and if the second selection circuit outputs the second reference voltage to the first capacitor portion of the second capacitor of the set of larger capacitors in the second conversion period, the second selection circuit outputting the second reference voltage to the first capacitor portion of the first capacitor of the set of larger capacitors in the second capacitor array;

the third comparison result and the fourth comparison result are different.

6. The method of claim 1, further comprising:

in a second sampling period, the first selection circuit outputting the first reference voltage to the first capacitor in each set of capacitors in the first capacitor array and outputting the second reference voltage to the second capacitor in each set of capacitors in the first capacitor array, and the second selection circuit outputting the first reference voltage to the first capacitor in each set of capacitors in the second capacitor array and outputting the second reference voltage to the second capacitor in each set of capacitors in the second capacitor array;

in a third conversion period, the comparator comparing a voltage at the first input terminal and a voltage at the second input terminal to generate a third comparison result, the first selection circuit outputting the second reference voltage to the first capacitor of the set of larger capacitors in the first capacitor array, and the second selection circuit outputting the first reference voltage to the second capacitor of a set of larger capacitors in the second capacitor array; and in a fourth conversion period subsequent to the third conversion period, the comparator comparing a voltage at the first input terminal and a voltage at the second input terminal to generate a fourth comparison result, if the first selection circuit outputs the first reference voltage to the first capacitor portion of the second capacitor of the set of larger capacitors in the first capacitor array in the second conversion period, the first selection circuit outputting the first reference voltage to the first capacitor portion of the first capacitor of the set of larger capacitors in the first capacitor array, and if the second selection circuit outputs the second reference voltage to the first capacitor portion of the first capacitor of the set of larger capacitors in the second conversion period, the second selection circuit outputting the second reference voltage to the first capacitor portion of the second capacitor of the set of larger capacitors in the second capacitor array;

the third comparison result and the fourth comparison result are different.

7. The method of claim 1, further comprising:

in a second sampling period, the first selection circuit outputting the first reference voltage to the first capacitor in each set of capacitors in the first capacitor array and outputting the second reference voltage to the second capacitor in each set of capacitors in the first capacitor array, and the second selection circuit outputting the first reference voltage to the first capacitor in each set of capacitors in the second capacitor array and outputting the second reference voltage to the second capacitor in each set of capacitors in the second capacitor array;

in a third conversion period, the comparator comparing a voltage at the first input terminal and a voltage at the second input terminal to generate a third comparison result, the first selection circuit outputting the second reference voltage to the first capacitor of the set of larger capacitors in the first capacitor array, and the second selection circuit outputting the first reference voltage to the second capacitor of a set of larger capacitors in the second capacitor array; and in a fourth conversion period subsequent to the third conversion period, the comparator comparing a voltage at the first input terminal and a voltage at the second input terminal to generate a fourth comparison result, if the first selection circuit outputs the first reference voltage to the first capacitor portion of the second capacitor of the set of larger capacitors in the first capacitor array in the second conversion period, the first selection circuit outputting the first reference voltage to the first capacitor portion of the first capacitor of the set of larger capacitors in the first capacitor array, and if the second selection circuit outputs the second reference voltage to the first capacitor portion of the second capacitor of the set of larger capacitors in the second conversion period, the second selection circuit outputting the second reference voltage to the first capacitor portion of the first capacitor of the set of larger capacitors in the second capacitor array;

the third comparison result and the fourth comparison result are different.

8. The method of claim 1, further comprising:

in a second sampling period, the first selection circuit outputting the first reference voltage to the first capacitor in each set of capacitors in the first capacitor array and outputting the second reference voltage to the second capacitor in each set of capacitors in the first capacitor array, and the second selection circuit outputting the first reference voltage to the first capacitor in each set of capacitors in the second capacitor array and outputting the second reference voltage to the second capacitor in each set of capacitors in the second capacitor array;

in a third conversion period, the comparator comparing a voltage at the first input terminal and a voltage at the second input terminal to generate a third comparison result, the first selection circuit outputting the second reference voltage to the first capacitor of the set of larger capacitors in the first capacitor array, and the second selection circuit outputting the first reference voltage to the second capacitor of a set of larger capacitors in the second capacitor array; and in a fourth conversion period subsequent to the third conversion period, the comparator comparing a voltage at the first input terminal and a voltage at the second input terminal to generate a fourth comparison result, if the first selection circuit outputs the first reference voltage to the first capacitor portion of the first capacitor of the set of larger capacitors in the first capacitor array in the second conversion period, the first selection circuit outputting the first reference voltage to the first capacitor portion of the second capacitor of the set of larger capacitors in the first capacitor array, and if the second selection circuit outputs the second reference voltage to the first capacitor portion of the first capacitor of the set of larger capacitors in the second conversion period, the second selection circuit outputting the second reference voltage to the first capacitor portion of the second capacitor of the set of larger capacitors in the second capacitor array;

the third comparison result and the fourth comparison result are different.

9. An analog-to-digital converter comprising:

a first capacitor array comprising a plurality of sets of capacitors, each set of capacitors in the first capacitor array comprising a first capacitor and a second capacitor;

a first selection circuit coupled to the first capacitor array;

a second capacitor array comprising a plurality of sets of capacitors, each set of capacitors in the second capacitor array comprising a first capacitor and a second capacitor;

a second selection circuit coupled to the second capacitor array;

a comparator comprising a first input terminal coupled to the first capacitor array, and a second input terminal coupled to the second capacitor array; and a control logic circuit coupled to the first selection circuit, the second selection circuit, and the comparator;

wherein:

in a first sampling period, the first selection circuit is configured to output a first reference voltage to the first capacitor in each set of capacitors in the first capacitor array and output a second reference voltage to the second capacitor in each set of capacitors in the first capacitor array, and the second selection circuit is configured to output the first reference voltage to the first capacitor in each set of capacitors in the second capacitor array and output the second reference voltage to the second capacitor in each set of capacitors in the second capacitor array;

in a first conversion period, the comparator is configured to compare a voltage at the first input terminal and a voltage at the second input terminal to generate a first comparison result, the first selection circuit is configured to output the second reference voltage to a first capacitor of a set of larger capacitors in the first capacitor array, and the second selection circuit is configured to output the first reference voltage to a second capacitor of a set of larger capacitors in the second capacitor array;

in a second conversion period subsequent to the first conversion period, the comparator is configured to compare a voltage at the first input terminal and a voltage at the second input terminal to generate a second comparison result, the first selection circuit is configured to output the first reference voltage to a first capacitor portion of the first capacitor of the set of larger capacitors in the first capacitor array or a first capacitor portion of a second capacitor of the set of larger capacitors in the first capacitor array, and the second selection circuit is configured to output the second reference voltage to a first capacitor portion of a first capacitor of the set of larger capacitors in the second capacitor array or a first capacitor portion of the second capacitor of the set of larger capacitors in the second capacitor array; and the first comparison result and the second comparison result are different.

10. The analog-to-digital converter of claim 9, wherein:
the first comparison result indicates that the voltage at the first input terminal of the comparator is greater than the voltage at the second input terminal of the comparator;
the second comparison result indicates that the voltage at the first input terminal of the comparator is less than the voltage at the second input terminal of the comparator; and
the first reference voltage is greater than the second reference voltage.

11. The analog-to-digital converter of claim 9, wherein:
the first comparison result indicates that the voltage at the first input terminal of the comparator is less than the voltage at the second input terminal of the comparator;
the second comparison result indicates that the voltage at the first input terminal of the comparator is greater than the voltage at the second input terminal of the comparator; and
the first reference voltage is less than the second reference voltage.

12. The analog-to-digital converter of claim 9, wherein:
a capacitance of the first capacitor portion of the first capacitor of the set of larger capacitors of the first capacitor array is substantially equal to a capacitance of a first capacitor of a set of smaller capacitors of the first capacitor array;
a capacitance of the first capacitor portion of the second capacitor of the set of larger capacitors of the first capacitor array is substantially equal to the capacitance of the first capacitor of the set of smaller capacitors of the first capacitor array;
a capacitance of the first capacitor portion of the first capacitor of the set of larger capacitors of the second capacitor array is substantially equal to a capacitance of a first capacitor of a set of smaller capacitors of the second capacitor array; and
a capacitance of the first capacitor portion of the second capacitor of the set of larger capacitors of the second capacitor array is substantially equal to the capacitance of the first capacitor of the set of smaller capacitors of the second capacitor array.

13. The analog-to-digital converter of claim 9, wherein:
in a second sampling period, the first selection circuit is configured to output the first reference voltage to the first capacitor in each set of capacitors in the first capacitor array and output the second reference voltage to the second capacitor in each set of capacitors in the first capacitor array, and the second selection circuit is configured to output the first reference voltage to the first capacitor in each set of capacitors in the second capacitor array and output the second reference voltage to the second capacitor in each set of capacitors in the second capacitor array;
in a third conversion period, the comparator is configured to compare a voltage at the first input terminal and a voltage at the second input terminal to generate a third comparison result, the first selection circuit is configured to output the second reference voltage to the first capacitor of the set of larger capacitors in the first capacitor array, and the second selection circuit is configured to output the first reference voltage to the second capacitor of a set of larger capacitors in the second capacitor array;
in a fourth conversion period subsequent to the third conversion period, the comparator is configured to compare a voltage at the first input terminal and a voltage at the second input terminal to generate a fourth comparison result, if the first selection circuit outputs the first reference voltage to the first capacitor portion of the first capacitor of the set of larger capacitors in the first capacitor array in the second conversion period, the first selection circuit is configured to output the first reference voltage to the first capacitor portion of the second capacitor of the set of larger capacitors in the first capacitor array, and if the second selection circuit outputs the second reference voltage to the first capacitor portion of the second capacitor of the set of larger capacitors in the second conversion period, the second selection circuit is configured to output the second reference voltage to the first capacitor portion of the first capacitor of the set of larger capacitors in the second capacitor array; and
the third comparison result and the fourth comparison result are different.

14. The analog-to-digital converter of claim 9, wherein:
in a second sampling period, the first selection circuit is configured to output the first reference voltage to the first capacitor in each set of capacitors in the first capacitor array and output the second reference voltage to the second capacitor in each set of capacitors in the first capacitor array, and the second selection circuit is configured to output the first reference voltage to the first capacitor in each set of capacitors in the second capacitor array and output the second reference voltage to the second capacitor in each set of capacitors in the second capacitor array;
in a third conversion period, the comparator is configured to compare a voltage at the first input terminal and a voltage at the second input terminal to generate a third comparison result, the first selection circuit is configured to output the second reference voltage to the first capacitor of the set of larger capacitors in the first capacitor array, and the second selection circuit is configured to output the first reference voltage to the second capacitor of a set of larger capacitors in the second capacitor array;
in a fourth conversion period subsequent to the third conversion period, the comparator is configured to compare a voltage at the first input terminal and a voltage at the second input terminal to generate a fourth comparison result, if the first selection circuit outputs the first reference voltage to the first capacitor portion of the second capacitor of the set of larger capacitors in the first capacitor array in the second conversion period, the first selection circuit is configured to output the first reference voltage to the first capacitor portion of the first capacitor of the set of larger capacitors in the first capacitor array, and if the second selection circuit outputs the second reference voltage to the first capacitor portion of the first capacitor of the set of larger capacitors in the second conversion period, the second selection circuit is configured to output the second reference voltage to the first capacitor portion of the second capacitor of the set of larger capacitors in the second capacitor array; and
the third comparison result and the fourth comparison result are different.

15. The analog-to-digital converter of claim 9, wherein:
in a second sampling period, the first selection circuit is configured to output the first reference voltage to the first capacitor in each set of capacitors in the first capacitor array and output the second reference voltage to the second capacitor in each set of capacitors in the first capacitor array, and the second selection circuit is configured to output the first reference voltage to the first capacitor in each set of capacitors in the second capacitor array and output the second reference voltage to the second capacitor in each set of capacitors in the second capacitor array;

in a third conversion period, the comparator is configured to compare a voltage at the first input terminal and a voltage at the second input terminal to generate a third comparison result, the first selection circuit is configured to output the second reference voltage to the first capacitor of the set of larger capacitors in the first capacitor array, and the second selection circuit is configured to output the first reference voltage to the second capacitor of a set of larger capacitors in the second capacitor array;

in a fourth conversion period subsequent to the third conversion period, the comparator is configured to compare a voltage at the first input terminal and a voltage at the second input terminal to generate a fourth comparison result, if the first selection circuit outputs the first reference voltage to the first capacitor portion of the second capacitor of the set of larger capacitors in the first capacitor array in the second conversion period, the first selection circuit is configured to output the first reference voltage to the first capacitor portion of the first capacitor of the set of larger capacitors in the first capacitor array, and if the second selection circuit outputs the second reference voltage to the first capacitor portion of the second capacitor of the set of larger capacitors in the second conversion period, the second selection circuit is configured to output the second reference voltage to the first capacitor portion of the first capacitor of the set of larger capacitors in the second capacitor array; and the third comparison result and the fourth comparison result are different.

16. The analog-to-digital converter of claim 9, wherein:

in a second sampling period, the first selection circuit is configured to output the first reference voltage to the first capacitor in each set of capacitors in the first capacitor array and output the second reference voltage to the second capacitor in each set of capacitors in the first capacitor array, and the second selection circuit is configured to output the first reference voltage to the first capacitor in each set of capacitors in the second capacitor array and output the second reference voltage to the second capacitor in each set of capacitors in the second capacitor array;

in a third conversion period, the comparator is configured to compare a voltage at the first input terminal and a voltage at the second input terminal to generate a third comparison result, the first selection circuit is configured to output the second reference voltage to the first capacitor of the set of larger capacitors in the first capacitor array, and the second selection circuit is configured to output the first reference voltage to the second capacitor of a set of larger capacitors in the second capacitor array;

in a fourth conversion period subsequent to the third conversion period, the comparator is configured to compare a voltage at the first input terminal and a voltage at the second input terminal to generate a fourth comparison result, if the first selection circuit outputs the first reference voltage to the first capacitor portion of the first capacitor of the set of larger capacitors in the first capacitor array in the second conversion period, the first selection circuit is configured to output the first reference voltage to the first capacitor portion of the second capacitor of the set of larger capacitors in the first capacitor array, and if the second selection circuit outputs the second reference voltage to the first capacitor portion of the first capacitor of the set of larger capacitors in the second conversion period, the second selection circuit is configured to output the second reference voltage to the first capacitor portion of the second capacitor of the set of larger capacitors in the second capacitor array; and the third comparison result and the fourth comparison result are different.

* * * * *